Figure 1:
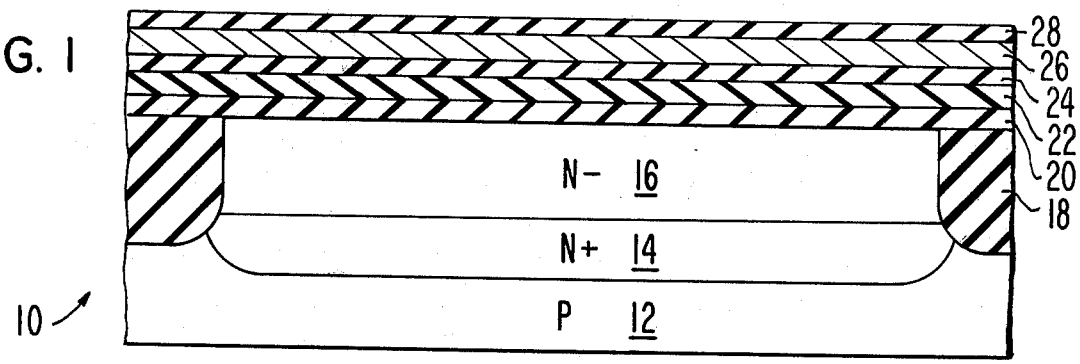

United States Patent [19]

Hingarh

[11] 4,298,402

[45] Nov. 3, 1981

[54] METHOD OF FABRICATING SELF-ALIGNED LATERAL BIPOLAR TRANSISTOR UTILIZING SPECIAL MASKING TECHNIQUES

[75] Inventor: Hemraj K. Hingarh, San Jose, Calif.

[73] Assignee: Fairchild Camera & Instrument Corp., Mountain View, Calif.

[21] Appl. No.: 118,291

[22] Filed: Feb. 4, 1980

[51] Int. Cl.³ .................... H01L 21/265; H01L 21/20
[52] U.S. Cl. ....................................... 148/1.5; 29/578;
29/580; 148/174; 148/187; 156/628; 156/653;
156/659.1; 156/662; 357/35; 357/59; 357/91;
357/92
[58] Field of Search ........................ 148/1.5, 174, 187;
29/578, 580; 156/628, 648, 649, 657, 653, 662,
659.1; 357/35, 59, 92, 91

[56] References Cited

U.S. PATENT DOCUMENTS

| | | | |
|---|---|---|---|
| 3,738,880 | 6/1973 | Laker | 156/628 |
| 3,817,794 | 6/1974 | Beadle et al. | 148/187 X |
| 4,026,733 | 5/1977 | Owen et al. | 148/1.5 |
| 4,026,740 | 5/1977 | Owen | 156/628 |
| 4,057,895 | 11/1977 | Ghezzo | 29/580 X |
| 4,066,473 | 1/1978 | O'Brien | 148/1.5 |
| 4,124,933 | 11/1978 | Nicholas | 26/578 |
| 4,168,999 | 9/1979 | Vora et al. | 148/175 |
| 4,200,878 | 4/1980 | Ipri | 148/187 X |
| 4,201,603 | 5/1980 | Scott et al. | 148/174 |

*Primary Examiner*—L. Dewayne Rutledge
*Assistant Examiner*—W. G. Saba
*Attorney, Agent, or Firm*—Paul J. Winters; Theodore S. Park; Michael J. Pollock

[57] ABSTRACT

A surface oriented lateral bipolar transistor having a base of narrow width is fabricated by using a doped polycrystalline silicon layer as an ion implantation mask when implanting ions for the emitter and base regions. In forming the doped polysilicon mask, a first layer of dopant masking material is formed on the surface of a semiconductor substrate, a second layer of undoped polysilicon is formed over the first layer, and a third layer of dopant masking material is formed over the second layer. Portions of the second and third layers are removed and a dopant is diffused into the exposed edge portion of the second layer. The third layer and the undoped portion of the second layer are then removed thereby leaving only the doped portion of the second layer on the first layer.

1 Claim, 7 Drawing Figures

METHOD OF FABRICATING SELF-ALIGNED LATERAL BIPOLAR TRANSISTOR UTILIZING SPECIAL MASKING TECHNIQUES

This invention relates generally to semiconductor technology, and more particularly the invention relates to fabrication of semiconductor devices having submicron dimensions.

Modern electronic circuits are fabricated in integrated semiconductor bodies by the selective introduction of P and N type dopants into the semiconductor body. The diffusion or implantation of dopant requires the formation of a mask on the surface of the semiconductor body to control the selective introduction of the dopant.

The size limitation of integrated circuits depends largely on the accuracy of dopant mask alignment. Present design rules typically require a three or four micron line width to insure accurate mask alignment. Thus, the smallest dimension which can be fabricated accurately can be limited to 3-4 microns.

An object of the present invention is a method of accurately defining a dopant mask.

Another object of the invention is a method of fabricating a lateral transistor having a submicron base width.

Still another object of the invention is a method of fabricating a transistor with a self-aligned base.

Yet another object of the invention is an improved method of fabricating an integrated injection logic device.

A feature of the invention is the use of doped polycrystalline semiconductor material as a dopant mask.

Briefly, in accordance with the present invention, the method of accurately defining a sub-micron dopant mask on the surface of a semiconductor body comprises the steps of forming a layer of undoped polycrystalline semiconductor material over a surface of the semiconductor body and forming a dopant masking layer over the undoped polycrystalline silicon. Thereafter, a portion of the dopant mask and the polycrystalline semiconductor material thereunder are removed. A dopant is then diffused into the exposed edge portion of the undoped polycrystalline semiconductor material after which the dopant mask layer and the undoped polycrystalline semiconductor material are removed by application of a preferential etchant whereby the doped polycrystalline material is left intact.

In fabricating a surface-oriented lateral bipolar transistor, a first layer of dopant masking material is formed on a doped surface of a semiconductor body. Thereafter, a second layer of undoped polycrystalline silicon is formed on the layer of dopant masking material and a third layer of dopant masking material is formed on the surface of the second layer. Thereafter, the second layer and the third layer are removed from a portion of the first layer, thereby exposing an edge portion of second layer. A dopant is then diffused into the edge portion of the second layer to define a doped region of sub-micron dimensions. Thereafter, the third layer and the undoped second layer are removed by preferential etching whereby the doped polycrystalline silicon remains intact and is used as a mask in the subsequent implantation of a dopant into the semiconductor body thereby forming surface regions for the emitter and collector of the bipolar transistor with the undoped surface region underlying the doped polycrystalline silicon comprising the base region of the transistor.

The surface-oriented bipolar transistor may comprise the lateral injector transistor in an integrated injection logic (I$^2$L) cell. Fabrication of the vertical bipolar transistor of the I$^2$L cell further includes the steps of selectively applying a resist over the first layer prior to implanting the dopant whereby a collector region of the vertical bipolar transistor is masked from the implanted dopant. Thereafter, the semiconductor body is heated to drive in the implanted dopant and further increase the thickness of the silicon oxide over the dopant-implanted region. The resist and underlaying silicon oxide layer are then removed, and a second resist layer is formed over the base region of the lateral transistor. Dopant of the first conductivity type is implanted in the collector region of the vertical transistor to define an intrinsic base region of the vertical transistor, and thereafter a dopant of opposite conductivity type is diffused into the exposed surface to define the collector region of the vertical transistor.

The invention and objects and features thereof will be readily apparent from the following detailed description and claims when taken with the drawing in which FIGS. 1-7 are cross-section views of a semiconductor body illustrating the steps in fabricating an I$^2$ device in accordance with one embodiment of the present invention.

Referring now to the drawing, FIG. 1 is a section view of a semiconductor body shown generally at 10 and including a P type substrate 12 having an N+ diffused region 14 formed in a major surface thereof. Overlaying the N+ region 14 is an N− epitaxial layer 16. Surrounding the epitaxial layer 16 and defining a device cell within the semiconductor body is a silicon oxide layer 18 which extends through the epitaxial layer. Such a structure is conveniently employed in oxide insulated semiconductor devices such as the Isopolanar integrated injection logic circuits manufactured by Fairchild Camera and Instrument Corporation, Assignee of the present application.

Overlaying the surface of the semiconductor body 10 is a first layer 20 of silicon oxide having a thickness of about 400 Angstroms, a second layer 22 of silicon nitride overlaying the layer 20 and having a thickness of about 1500 Angstroms, a third layer 24 of silicon oxide overlaying the second layer 22 and about 200 Angstroms thick, and a layer 26 of undoped polycrystalline silicon overlaying the layer 24 and having a thickness of about 5000 Angstroms. Overlaying the polycrystalline silicon layer 26 is a 3000 Angstrom layer of silicon oxide 28.

Figure 2:
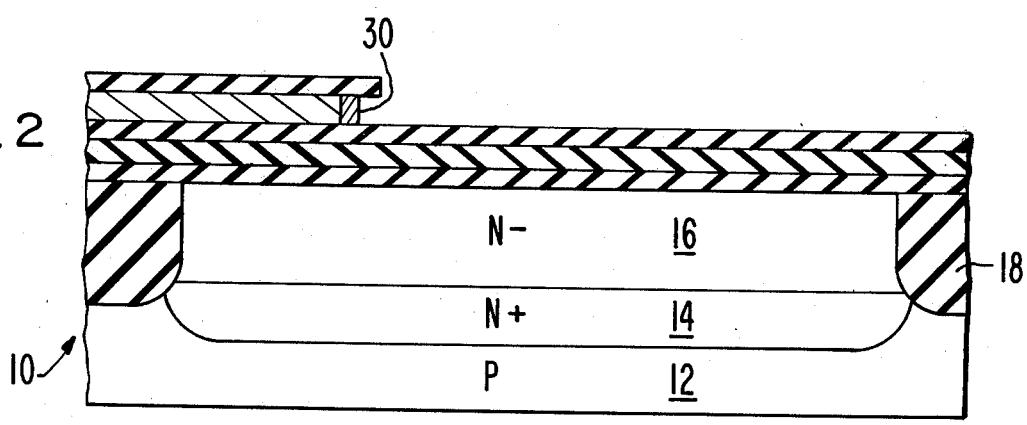

Referring to FIG. 2, a portion of the silicon oxide layer 28 and the underlying polycrystalline silicon layer 26 are removed from the surface of the semiconductor body 10 by photoresist masking and selective etching. A suitable etchant for the silicon oxide is a hydrofluoric acid (HF), and a suitable etchant for the undoped polycrystalline silicon is PED Etch.* Thereafter, a dopant such as boron is diffused into the exposed edge portion of the polycrystalline layer 26 thereby forming a P type region 30 in the polycrystalline layer 26. The width of the diffused region 30 can be controlled from 0.25 microns to 2 microns and will determine the width of the base region of a lateral bipolar transistor, as described hereinbelow.

*Described by Bassous in *IEEE Transaction on Electron Devices*, October 1978, Vol. ED25, No. 10, pp. 1178-85.

Figure 3:
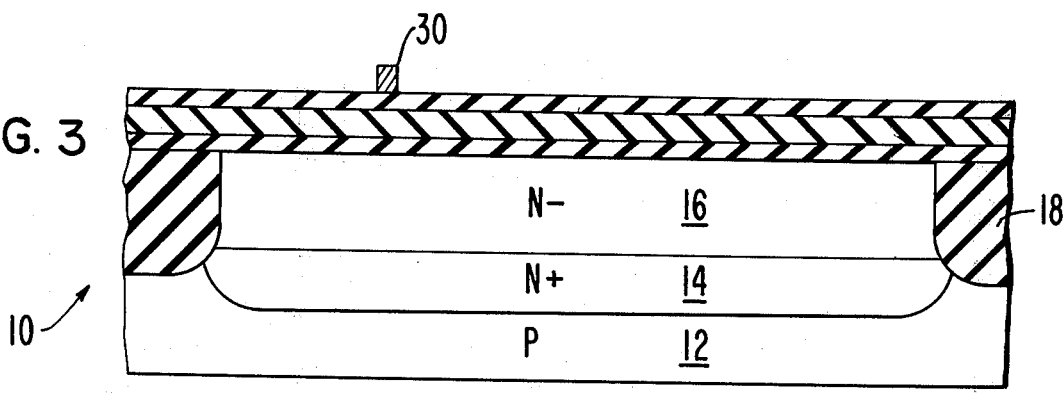

Thereafter, as illustrated in FIG. 3, the silicon oxide layer 28 is removed by HF, and a preferential etchant such as PED Etch is applied to the polycrystalline layer 26 whereby the undoped polycrystalline material is removed by the etchant while the doped polycrystalline silicon remains intact.

Figure 4:
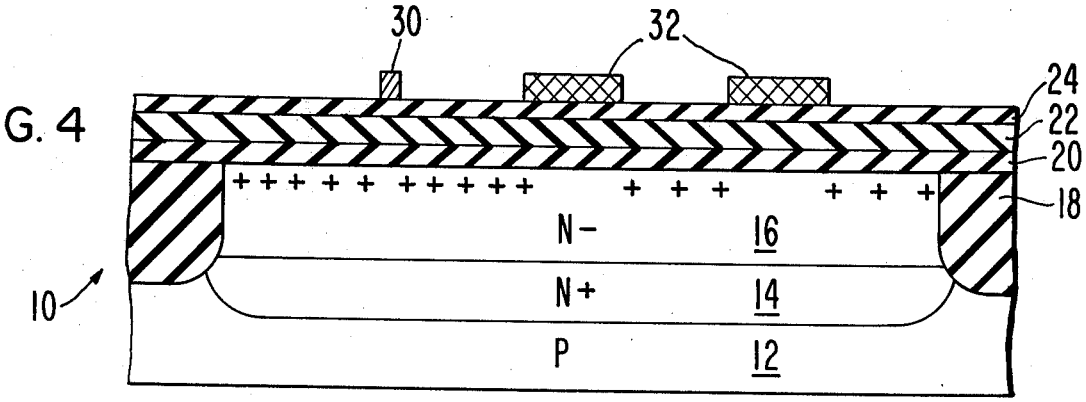

Referring to FIG. 4, photoresist material 32 is provided on the surface of layer 24 above the surface area of the semiconductor body 10 where the collector regions of a vertical NPN bipolar transistor are to be formed. The photoresist 32, along with the doped polycrystalline silicon 30, forms a mask for subsequent introduction of P type dopant ions such as boron by ion implantation as shown in FIG. 4. An ion concentration of $10^{14}$ ion per cm.$^2$ at 100 Kev. is suitable.

Figure 5:
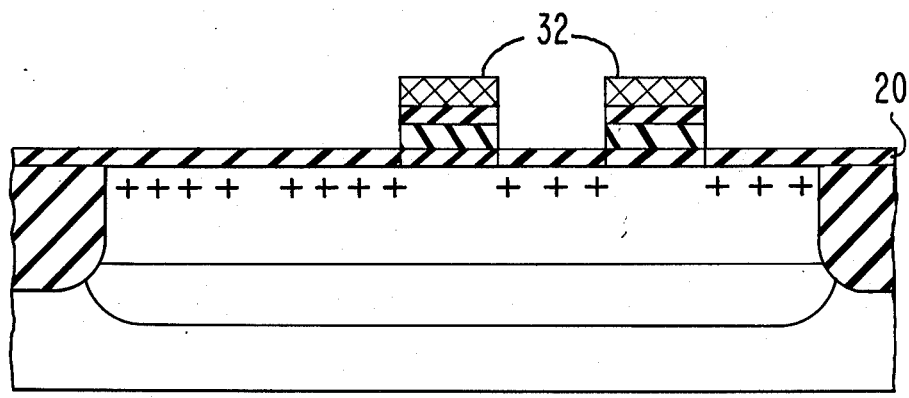

Thereafter, as illustrated in FIG. 5, the photoresist material 32 is retained on the surface of layer 24; and the polycrystalline material 30, the silicon oxide layer 24, and silicon nitride layer 22 not protected by the photoresist 32 are removed by suitable etchant. An etchant such as HF is used for removing the silicon oxide, and hot phosphoric acid is used to remove the silicon nitride. The structure is then heated to approximately 1,000° C. to drive in the boron dopant and increase the thickness of the exposed silicon oxide layer 20, thereby forming the emitter and collector regions 34 and 36 of the lateral transistor and the extrinsic base regions 38 and 40 of the vertical transistor.

Figure 6:
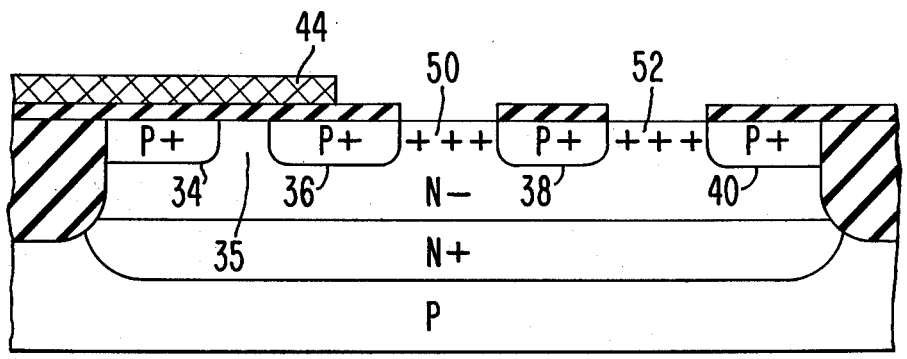

As shown in FIG. 6, a photoresist layer 44 is then formed on the surface of the structure overlaying the base region 35 of the lateral bipolar transistor, and P type dopant such as boron is then introduced into the surface regions 50 and 52 for defining the intrinsic base region of the vertical NPN bipolar transistor. An ion concentration of $10^{12}$ ion per cm$^2$ at 190 Kev. is suitable.

Figure 7:
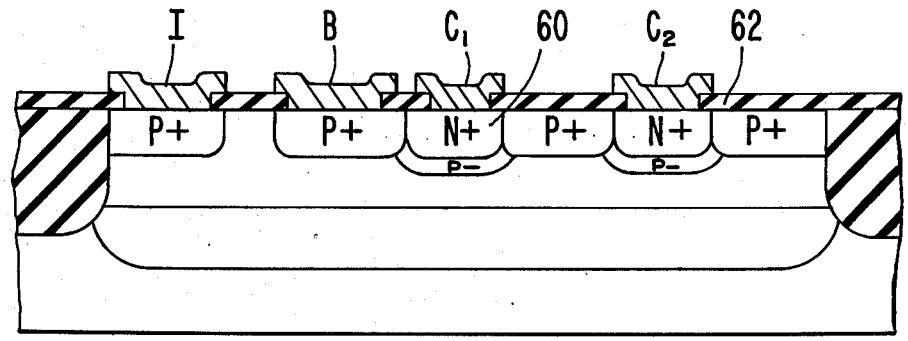

Finally, as illustrated in FIG. 7, the N+ collector regions 60 and 62 are formed by the diffusion of arsenic in the exposed surface of the regions 50 and 52 of FIG. 6. The collectors 60,62 preferably have a dopant concentration of at least $10^{20}$ atoms per cm$^3$.

Electrical contacts are made to the emitter and base regions 34,36 of the lateral PNP transistor and to the collectors 60 and 62 of the vertical NPN bipolar transistor to complete the device. Importantly, the base width 35 of the PNP transistor can be controlled to a fraction of a micron with the implantation of the emitter and collector regions using the base mask in accordance with the present invention.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

It is claimed:

1. A method for fabricating an integrated injection logic cell in a semiconductor body, said cell comprising a lateral bipolar injection transistor and a vertical bipolar transistor, comprising the steps of:
    (a) forming a first layer of dopant masking material on a surface of said semiconductor body, said surface being of a first conductivity type, said first layer comprising a first tier of silicon oxide overlaying said surface, a second tier of silicon nitride overlaying said first tier, and a third tier of silicon oxide overlaying said second tier;
    (b) forming a second layer of undoped polycrystalline silicon on said first layer of dopant masking material;
    (c) forming a third layer of silicon oxide on the surface of the second layer;
    (d) removing a portion of said third layer of silicon oxide and underlaying portion of said second layer of undoped polycrystalline silicon by photoresist masking and selective etching thereby exposing an edge portion of said second layer;
    (e) diffusing dopant into said exposed edge portion of said second layer thereby forming a doped portion of said second layer;
    (f) removing said third layer of silicon oxide;
    (g) removing said undoped second layer by preferential etchant such that said doped portion of said second layer remains intact;
    (h) implanting a dopant of opposite conductivity type into said surface of said semiconductor body using said doped portion of said second layer as an implant mask thereby forming surface regions in said semiconductor body of said opposite conductivity type separated by a surface region of said first conductivity type;
    (i) selectively applying a resist over said first layer prior to said step of implanting a dopant of opposite conductivity type whereby a collector region of said vertical bipolar transistor is masked from implanted dopant of opposite conductivity type;
    (j) heating said silicon conductor body to drive in said dopant of opposite conductivity type and increasing the thickness of said silicon oxide over the surface region of implanted dopant of opposite conductivity type;
    (k) removing said resist and first layer underlaying said resist;
    (l) applying a resist layer overlaying the base region of said lateral transistor;
    (m) immmplanting dopant of opposite conductivity in said semiconductor body in the collector region of said vertical bipolar transistor; and
    (n) diffusing dopant of first conductivity type into said exposed collector region.

* * * * *